Figure 1:
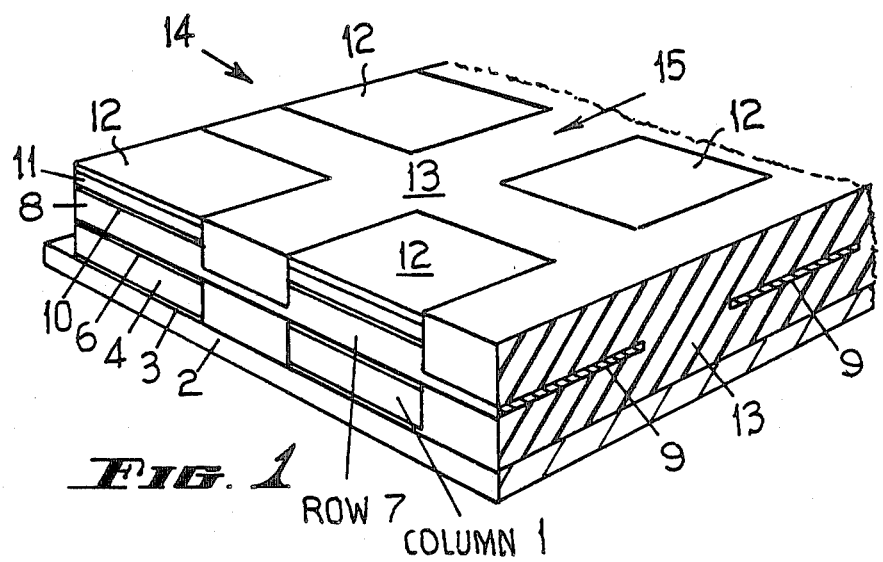

United States Patent [19]

McGlynn

[11] Patent Number: 4,771,183
[45] Date of Patent: Sep. 13, 1988

[54] PHOTO-ELECTRIC IMAGING DEVICE HAVING OVERLAYING ROW AND COLUMN ELECTRODES FORMING DISCRETE, INDEPENDENTLY ADDRESSABLE AREAS

[75] Inventor: Robert F. McGlynn, Willetton, Australia

[73] Assignee: Jabali Pty. Ltd., Bayswater, Australia

[21] Appl. No.: 97,967

[22] PCT Filed: Nov. 26, 1986

[86] PCT No.: PCT/AU86/00363
§ 371 Date: Jul. 27, 1987
§ 102(e) Date: Jul. 27, 1987

[87] PCT Pub. No.: WO87/03388
PCT Pub. Date: Jun. 4, 1987

[30] Foreign Application Priority Data

Nov. 26, 1985 [AU] Australia ............................ PH3574
Apr. 3, 1986 [AU] Australia ............................ PH5314

[51] Int. Cl.⁴ .......................................... H01J 40/14
[52] U.S. Cl. ................................... 250/578; 365/112
[58] Field of Search ....................... 250/578, 213 R; 365/112

[56] References Cited

U.S. PATENT DOCUMENTS

| | | | |
|---|---|---|---|
| 3,341,826 | 9/1967 | Lee | 250/213 A |
| 3,609,002 | 9/1971 | Fraser et al. | 365/112 |
| 3,792,258 | 2/1974 | Sliker | 250/213 A |
| 4,020,376 | 4/1977 | Bosserman et al. | 250/213 R |
| 4,110,014 | 8/1978 | Yevick | 250/213 R |
| 4,121,197 | 10/1978 | Ogawa et al. | 340/166 R |
| 4,363,963 | 12/1982 | Ando | 250/578 |
| 4,543,489 | 9/1985 | Harada et al. | 250/578 |
| 4,603,356 | 7/1986 | Bates | 250/578 |
| 4,654,536 | 3/1987 | Saito et al. | 250/578 |

FOREIGN PATENT DOCUMENTS

| | | |
|---|---|---|
| 1333111 | 10/1973 | United Kingdom . |
| 1385282 | 2/1975 | United Kingdom . |
| 2009051 | 6/1979 | United Kingdom . |

Primary Examiner—David C. Nelms
Assistant Examiner—William L. Oen
Attorney, Agent, or Firm—Cushman, Darby & Cushman

[57] ABSTRACT

A photo-electric imaging device having an array of rows (7) of minute electrodes (8) and an array of columns (1) of electrodes (4) overlying the rows and separated by semiconductor layer (6). Imaging plates (11) are positioned above each pair of respective electrodes (4, 8) and separated from them by an interface (10). A photoconductive layer (12) may be placed over the imaging plate (11). A writing surface (12) over the imaging plates (11) is produced which comprises a multiplicity of spaced discrete areas each independently addressable by selecting a row and a column.

15 Claims, 4 Drawing Sheets

PHOTO-ELECTRIC IMAGING DEVICE HAVING OVERLAYING ROW AND COLUMN ELECTRODES FORMING DISCRETE, INDEPENDENTLY ADDRESSABLE AREAS

This invention relates to a photo-electric imaging device and in particular it relates to a device which produces a high resolution readable image with a practical working resolution of 1,000,000 bits per square millimeter or optically 1000 lines per millimeter, the device being optically electronically addressable.

It is known in the art to provide an image by means of electrostatic development of discrete areas containing a charge and to grade the charges on each discrete area to produce an image.

As an example of the state of the art reference may be had to be U.S. Pat. No. 3,611,419, of John Blumenthal; granted 5th Oct., 1971 in which an electrographic imaging system is described in which an array of small electrodes are arranged in rows over a conductive plate, and a dielectric member is moved between the small electrodes and the conductive plate while a patterned electric field is generated to dynamically produce a latent electrostatic image on the dielectric member which can then be rendered visible by applying a toner of a selected polarity in a known manner.

In a further example as described in U.S. Pat. No. 3,774,168 of Tuh-Kai Koo et al a beam accessed semiconductor memory device has a series of integrated circuit wafers arranged in blocks on a substrate which are not interconnected but control is from means on the other side of the substrate, the memory device being actuated by an energy beam scanned across the blocks.

In U.S. Pat. No. 3,329,962 of R. A. Cola granted 4th July, 1967 a solid state electron transducer is described in which orthogonally arranged strips, which are separated from each other by an insulator, are disposed over an insulating-dielectric substrate in row and column format and energised to give beams of electrons or ions which produce a latent electrostatic image on a recording material. The latent electrostatic image is developed to render it visible.

In modified form Cola also describes an embodiment in which the orthogonal superimposed strips are replaced by orthogonal rows of conductors arranged in the same plane. The Patent refers to the electric field being produced in an insulating layer disposed between selected electrodes to cause electron emission into an air gap as a result of quantum mechanic tunnelling.

As a further example of prior art reference may be had to two U.S. Pat. Nos. 3,979,757 and 3,979,758, in the name of Jack S. Kilby et al, in which according to one form a large number of electrodes are presented at the surface of a module and are energisable individually by using shift registers which control the charge on the individual electrodes.

The electrodes are energised by separate bistable circuit means and the Patent has reference to which is generally now referred to as "half tone" effects, that is a grading of the deposit to produce different shades of colour.

The object Of the present invention is to provide certain improvements in this general art and particularly in the method of construction and use of a module of this type, it being a further object to provide a module which can produce an image which may be developed and visually displayed or in which an image can be projected onto the module to store the image on a computer, a further object being to provide an image on the module having high resolution and to provide a module which can readily be constructed by present day known integrated circuit techniques. Other objects will be apparent from the description of the invention.

The invention comprises a module having a substrate and on the substrate rows and columns of electrodes at least partly electrically isolated from the substrate with the electrodes of the rows and the electrodes of the columns disposed one over the other but isolated one from the other by a semiconductor interface, and disposed over each pair of electrodes an imaging plate at least partly electrically isolated from the electrodes but connected to the electrodes through a control transistor whereby the imaging plate forms one member of a capacitor in association with its adjacent electrode.

In this way as the electrodes of a row and column are appropriately energised, the imaging plate associated with each pair of discrete electrodes is conditioned to either receive a charge or no charge or to receive a graduated charge according to the type of image which is to be reproduced.

The imaging plates can of course be given a positive or a negative charge of a selected magnitude-and the imaging plates can be visually imaged by the application of a developer of the opposite charge in the areas where a field exists. When it is desired to use the module to store light images the imaging plates have a photoconductive layer on them, or could be formed of a photoconductor, so that a light image can then be applied to the photoconductor and the image read off by the computer which can then store the data representing the image and it can be recalled at any time either for reading or reprinting.

Thus the invention provides a highly effective system of storing and reproducing images in a relatively simple assembly in association with a computer.

According to this invention an optical image may be converted into a latent digital image through a photoelectric image device, allowing an operator to recall the image onto a computer terminal to be checked, edited and modified at will. When this operation is completed the operator can transfer the modified image back to the photo-electric image device in digital form to obtain a permanent optical image or record.

An advantage of the imaging device according to this invention is that the module can be electronically imaged without the aid of CRT's or laser scan devices. Drawings and information created on or by computers can be stored permanently in the photo-electric image translator in an optical form. This image can then be viewed optically or accessed electronically through the translation by any computer system. Also the data or image in the photo-electric modules can be optically viewed by a conventional lens system. Further after the image is expressed optically it can be held in a temporary digital state until fixed permanently by a rendering solution.

The photo-electric module is inactive electronically until it has been electrically enabled. This allows the module to be stored in any reasonable environment without protection from magnetism, light, heat or humidity. In this disabled state, the module is still optically readable.

Such a photo-electric image module does not need re-energising like magnetic tapes or discs. The materials used in its manufacture are inorganic and the solutions to render the image permanent are mainly thermo-plastics or modified carbon solutions resulting in a stable archival information recording means of long life.

A typical module consists of a substrate with externally exposed minute pairs of imaging plates positioned on a writing surface. Each imaging plate of the pairs is electrically addressable through a row-column matrix, which is switched by integrated circuit means.

The method of writing to the photo-electric image module comprises switching it from its neutral state to an active state by electronic control circuits, and after the data is switched to the module it can be rendered into a permanent optical image by for instance the use of a bias plate in close proximity to the photoelectric image module, a voltage potential being created between these microscopic electrodes and the bias plate in the presence of a rendering solution to cause the charged particles in the solution to migrate rapidly to activated electrodes, the bias plate enhancing this process by controlling and stimulating the flow of negatively charged particles. After removal of the bias plate, any free rendering solution is removed by a suction or other device so that the permanent image so formed can be optically inspected on the module.

Electronical reading of the optical image may be effected by applying, by xerographic means, an insulating film over the electrodes which are energised to make up the image, and then applying a non-volatile conductive liquid between electrodes and the optical image and applying a voltage so that where the electrodes are covered by the insulating film no electron transaction takes place.

By this method a composite electronic picture is rapidly created by the fast cycle speed of the integrated circuits.

The imaging module results in a very small, very high-capacity storage system which enabled inspection of the memory electronically as well as optically in a manner which allows ready reading, and results in a quality optical image together with a large storage density and fast electronic access.

In its basic form the photoelectric imaging device according to this invention comprises a series of minute electrodes arranged in rows and columns and adapted to be addressed oy electronic means in accordance with their location on a module, characterised by a first layer of spaced electrodes arranged in row format and a second layer of spaced electrodes arranged in column format with each row electrode disposed over a column electrode but isolated one from the other by a semiconductive interface, an imaging plate positioned over each pair of associated electrodes but isolated from the adjacent electrode by an interface, electrical coupling means between the electrodes of each pair of electrodes and the associated imaging plate, and an insulating medium between laterally spaced pairs of electrodes and imaging plates, whereby to form a rigid module having a writing surface over the imaging plates comprising a multiplicity of spaced discrete areas each independently addressable by selecting a row and a column.

The imaging plates are addressable to store an image on a computer, or are addressable by the computer to store the image on a selected medium. The use 30. of a photoconductor on the imaging plates allows a light image to be directly stored on a computer.

Thus each imaging plate can be independently energised by selected energisation of a row and column, and similarly the application of a potential directly to or by the photoconductive layer on the imaging plate can be applied to the computer in an addressable manner. The photoconductor surface of each imaging plate can be rendered visible for direct reading by applying developer particles, such as from a liquid developer by means of which a dot image of fine resolution is attainable.

The method of imaging a writing surface on an addressable module which module comprises as above defined, applying a signal to selected imaging plates on the writing surface of the module to define an electrostatic image on the writing surface, addressing the rows and columns by a computer to store the image in the computer memory, subsequently receiving the stored data from the computer on the imaging plates in the form of a charge by addressing the rows and columns, and rendering the image addressable.

In order however that the invention will be fully understood, embodiments thereof will now be described with reference to the accompanying drawings in which FIG. 1 is a perspective view of portion of a module showing the imaging plates and indicating the pairs of electrodes which are used at each row and column crossing.

Figure 2:
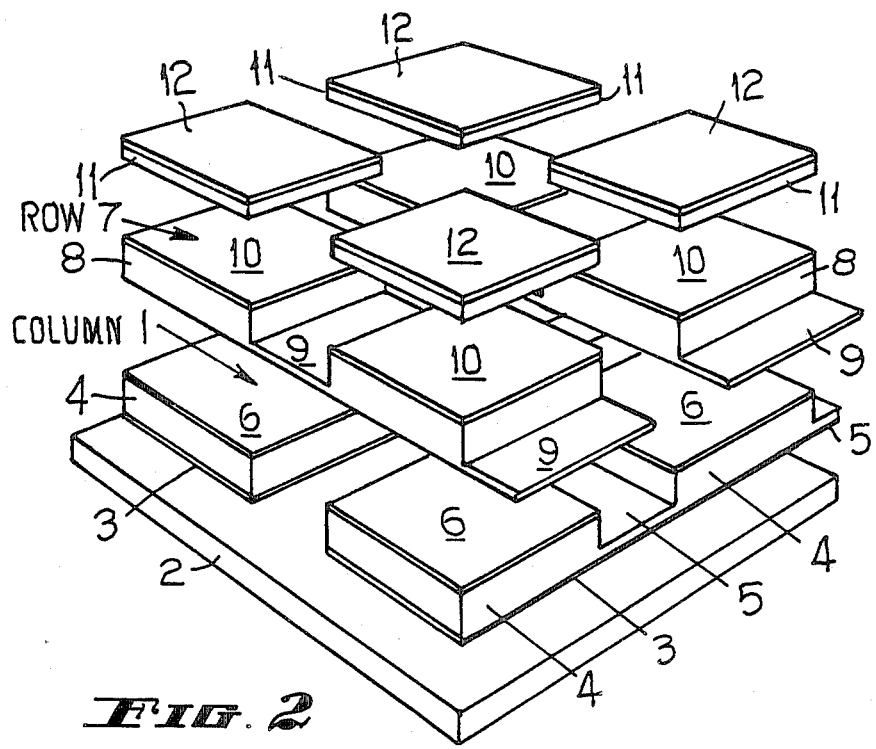
Figure 3:
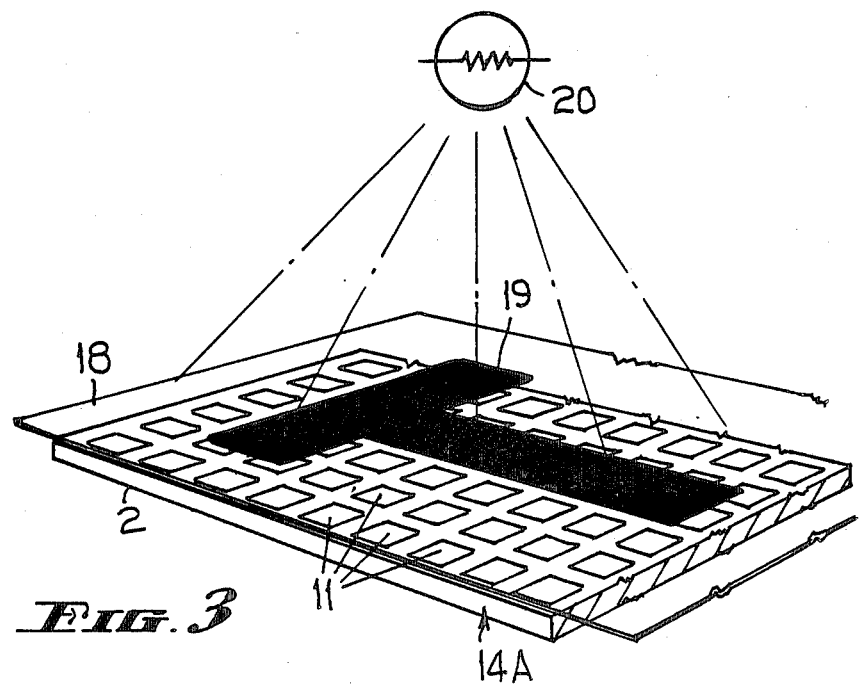
Figure 4:
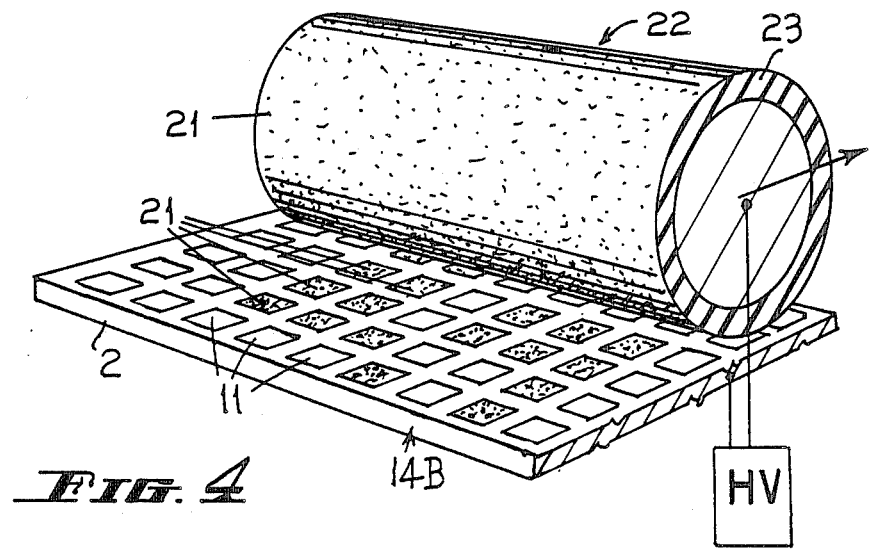
Figure 5:
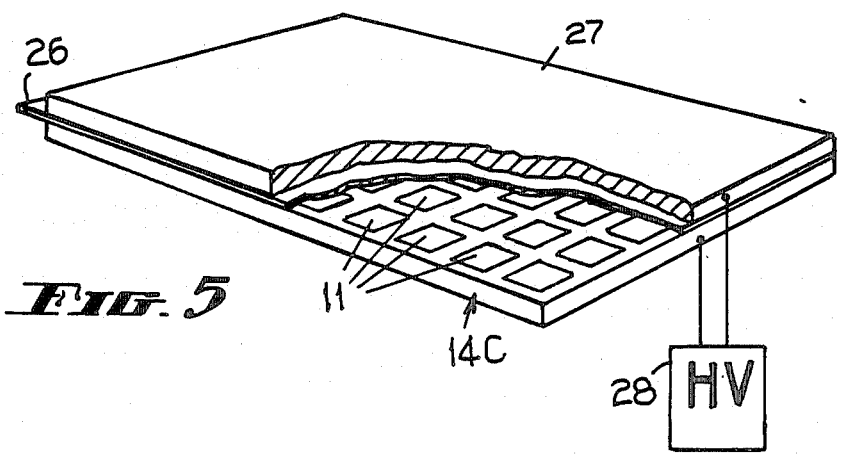
Figure 6:
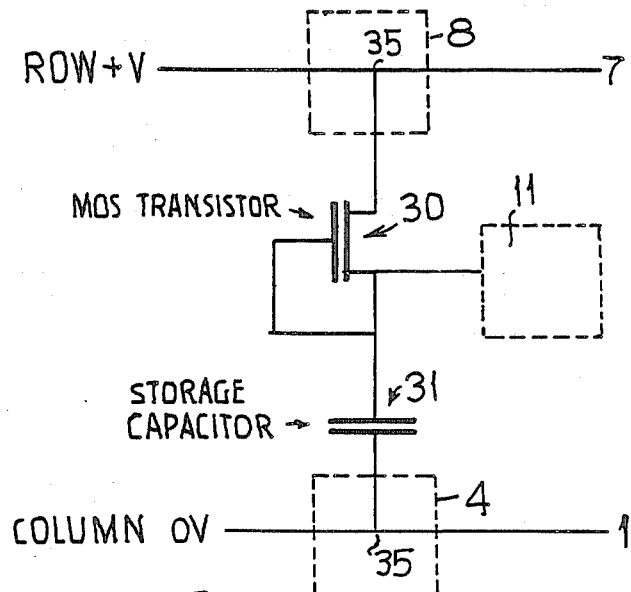
Figure 7:
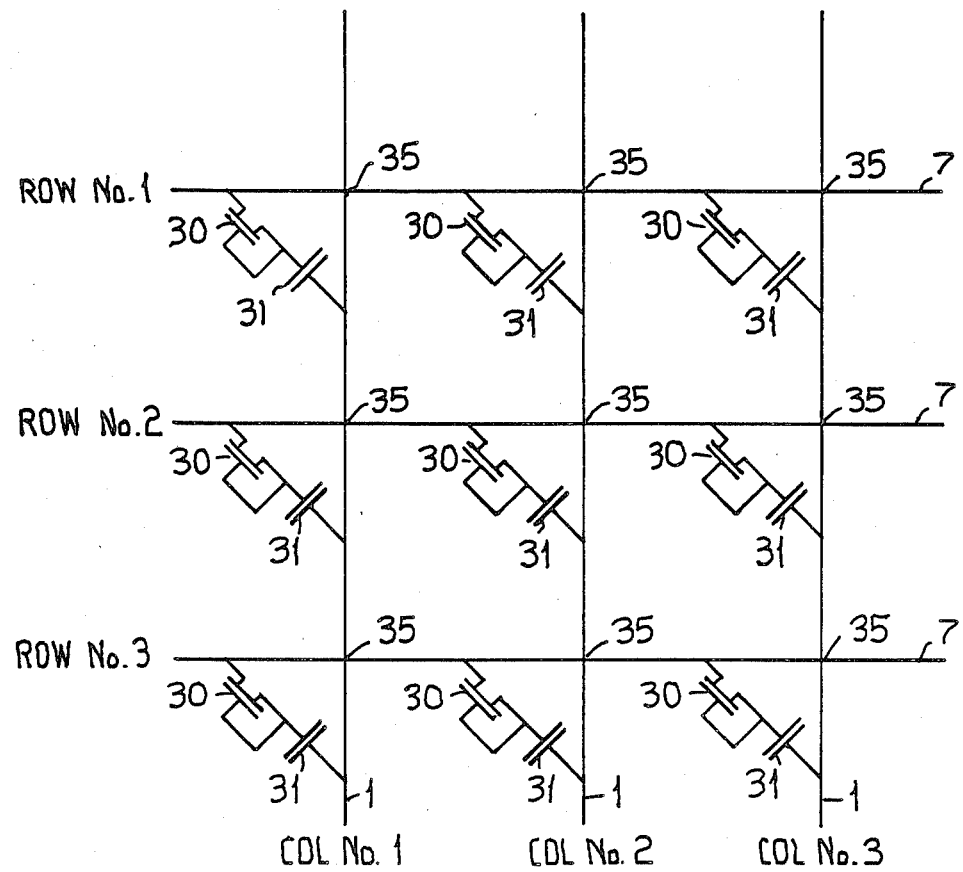

FIG. 2 is an exploded perspective view of portion of such a module showing the basic configuration of elements, omitting the insulating medium which effects lateral isolation of the minute electrodes and imaging plates and forms a rigid module, FIG. 3 is a perspective view showing how a module constructed according to the invention can be used to record a light image from a transparency, FIG. 4 is a perspective view showing how a module on which an image is stored can be developed by a marking medium/to render it visible or electronically addressable in a more permanent form, FIG. 5 is a perspective view of portion of a module showing how a transfer member may be used to remove a developed image for storage, FIG. 6 is a diagram showing a storage cell, and FIG. 7 is a diagram showing the electrical configuration of the module.

Referring first to the module and its construction as defined in FIGS. 1 and 2, a first layer 1 is built up on a substrate 2 to be insulated therefrom by interfaces 3, or the substrate 2 itself may be a relative insulator.

The first layer 1 comprises a series of minute electrodes 4 positioned in column arrays, the electrodes 4 of each row being joined by an integral conductor strip 5 to be addressable as a row. The electrodes are thus positioned, as it were, on a strip 5. Each of the minute electrodes 4 has deposited on it, or is formed to have, a semi-conductor interface layer 6.

Similarly the second layer 7 comprises a series of minute electrodes 8 Joined together as rows by integral conductor strips 9, the minute electrodes 8 being each positioned over a corresponding electrode 4 in the first layer, but separated by the semi-conductor interface layers 6.

Each of the electrodes 8 has on its face a semiconductor interface layer 10, and over these layers 10 are placed a series of imaging plates 11, one over each minute electrode 8. The interface means may however be formed on the imaging plates 11 or otherwise positioned between the electrodes 8 and the imaging plates 11.

The outer surface of each imaging plate 11 has on it a photoconductive surface 12 which is preferably applied electrically such as by sputtering to orientate the photoconductive medium to have the particles normal to the surface but for some uses this photoconductive layer 12 may be omitted.

The spaces between the electrodes 4 and 8 and semiconductor layers 6 and 10 and between the imaging plates are filled with an insulating medium 13 to result in a module 14 having a planar writing surface 15, each module thus comprising a series of pairs of electrodes 4, 8 arranged in rows and columns and having an imaging plate 11 on each pair, all set in the insulating medium 13.

The invention can be applied successively by filling the spaces in the first layer 1 with insulator medium and then building up the second layer 7 and the imaging plates 11 and filling the further spaces with an insulator.

The upper surface of the module can be polished to a high finish, this assisting development of an image on the surface by for instance an ultra fine elctrostatic imaging medium.

As stated earlier herein, this invention allows an optical image to be converted into a latent digital image through the electric imaging module described, allowing an operator to recall the image onto a computer video display terminal to be checked, edited and modified at will. When this operation is completed the operator can then transfer the modified image back to the electric image device in digital form to obtain a permanent optical image, or can store it in the computer.

The data or images in the electic imaging device can be applied in many ways but FIGS. 3, 4 and 5 indicate some of the applications.

In FIG. 3 is illustrated how an image can be applied to the module 14A, a transparency 18 containing a visual image 19 is placed over the writing face 15 of the module and an ulimination source 10 causes the visual image 19 to modify the charge on the imaging plates 11 and this modified charge can be read by a computer by means of the row and column assembly of the layers 1 and 7. In this case the photoconductor surface 12 is used.

The photoconductive layer 12 on the imaging plates 11 can be charged prior to light bleeding of the photoconductor by means of the light source 20, the photoconductor bleeding the charge according to the amount of light projected onto the imaging plates 11 at any particular locality so that the image is produced electrostatically on the imaging plates 11 and can be read by addressing the rows and columns which index the area of each of the imaging plates 11. The electrostatic image could however be produced on a photoconductive surface and the latent image transferred to the imaging plates by contact.

In FIG. 4, the module 14B is shown having a rendering solution 21 applied to it from an applicator 22 which can be in the nature of a roller adapted to carry the rendering solution on a resilient outer surface 23 which is rolled over the module 14 after the photoconductor on the module has been light bled by a method such as that referred to in relation to FIG. 3, thus causing deposition of the rendering solution on the surface to provide a visually readable image. At the same time this image can be addressed by a computer by reading selective development of the image area.

A biasing voltage is preferably applied between the applicator 22 and the module 14 as indicated by the high voltage means 24.

In FIG. 5, the module 14C has been subjected to development of a latent electric electrostatic image on the photoconductor on the imaging plates. Placed over the module 14C is a receiving sheet 26 over which is placed an electrode 27 and a polarised voltage is applied between the electrode and the module 14 by a high voltage device 28 to cause transfer of the developer held on the imaging plates 11 to the receiving sheet, after which the image is held on the receiving sheet.

Instead of using the system shown in FIG. 5, a rendering solution may flow over the writing surface 15 of the module to develop the latent electrostatic image on the photoconductive layer 12 of the imaging plates, but preferably development is enhanced by using a biasing electrode to urge flow of the marking medium onto the image areas, the bias being removed after the image has been developed and any surplus rendering solution removed by a suction or similar device. The image can then be optically inspected and is permanent.

Electronically reading of an optical image created by the described module can be effected by bringing an electrode into close proximity to the photoelectric image module which holds the image, the image being made up of minute insulating particles comprising modified carbon/thermo-plastic material as well known in xerographic development processes. These particles may place an insulating film over selected parts of the imaging plates 11 and it will be realised that by a selection of the type of marking particles and the polarity thereof different final results can be obtained in the developed image and for intance the polarities can be arranged so that the developer which forms the image on the photoconductive layers 12 of the imaging plates prevents electron transaction to indicate level 0 whereas uncovered imagine plates 1 would give a reading of a higher voltage and indicate level 1.

FIG. 6 is shown how a storag]cell is formed, 30 representing a moss transistor, 31 a storage capacitor while the row and column connections are indicated by 7 and 1.

In FIG. 7 is shown how this system is applied. The columns and the rows form between then a series of junction sites 35 at which the electrodes 4 and 8 are formed, one electrode being connected with the row and the other with the column, and over these electrodes are placed the imaging plates. The imaging plates are connected to the storage capacitors 31 which are connected to the moss transistor 30 which maintains a charge on the plate when suitably activated by signals applied to the selected row and column lines. The imaging plate 11 could form the condenser with the electrode 4.

To operate this as a "write-read" operation, information is fed via a computer to the write head to both the rows and columns to activate the storage cells at the junctions in accordance with the data to be stored, this being stored in two discrete voltage levels, namely a higher supply voltage level and a lower supply voltage level. Each storage cell thus consists of a single transistor and a storage capacitor and such a cell is addressed by a row-select clock followed by column-select data.

The transistor 30 and capacitor 31 construction may be carried out by VLSI techniques with the transistor 30 side of the capacitor 31 connected to the imaging plate 11 and the other side of the capacitor connected to an electrode whereby each image plate represents one cross point in the matrix shown.

The read head can be used to digitize a light, whether positive or negative, and this may be achieved by placing cadmium sulphide crystals on top of each image plate, the crystals preferably being deposited onto the image plates by a sputtering process which produces crystals standing on end. The sequence of operation is to charge all capacitors, to cause the crystals to take on the charge on the image plate, place the image to be digitized over the image plates, expose with light, discharging any crystals by the light falling on it, and then reading the data from the storage capacitors.

When reading data from the storage cells it is passed through sensing amplifiers and transmitted to output buffers. Sensing of these storage cells is destructive and after a sensing cycle at least some level of the information is lost, but if required it can be restored through an automatic re-write cycle.

From the foregoing it will be appreciated that an addressable module is provided which can be addressed by a computer to digitally store an image, or a stored image can be reproduced by the module in readable form and may be transferred to a receiving sheet by, for instance, well known xerographic processes or other image copying means.

I claim:

1. A photoelectric imaging device comprising a series of minute electrodes arranged in rows and columns and adapted to be addressed by electronic means in accordance with their location on a module, characterised by a first layer of spaced electrodes (8) arranged in row format (7) and a second layer of spaced electrodes (4) arranged in column (1) format with each row electrode (8) disposed over a column electrode (4) but isolated one from the other by a semiconductive interface (6), an imaging plate (11) positioned over each pair of associated electrodes (4,8) but isolated from the adjacent electrode by an interface (10), electrical coupling means (30,31) between the electrodes of each pair of electrodes (4,8) and the associated imaging plate (11), and an insulating medium (13) between laterally spaced pairs of electrodes (4,8) and imaging plates (11), whereby to form a module having a writing surface (15) over the imaging plates comprising a multiplicity of spaced discrete areas each independently addressable by selecting a row (7) and a column (1).

2. A photoelectric imaging device according to claim 1 characterised in that each imaging plate has at least on its outer surface a photoconductive layer (12).

3. A photoelectric imaging device according to claim 1 or 2 characterised in that the electrical coupling means (30,31) between each pair of electrodes (4,8) and the associated imaging plate (11) comprise a transistor (30) for flow control and a capacitor (31) whereby a charge can be stored on the imaging plate (11), the imaging plate (11) being associated with one plate (8) of the capacitor.

4. A photoelectric imaging device according to claim 3 wherein a transitor is connected between a row electrode (8) and a first side of a capacitor (31), the other plate of the capacitor (31) being connected to the column electrode (4) and wherein the first side of the capacitor is connected to the imaging plate (11).

5. A photoelectric imaging device according to claim 3 wherein the capacitor is formed at least in part by the imaging plate (11) and an electrode (4) of the pair of electrodes (4,8).

6. A photoelectric imaging device according to claim 2 wherein the imaging plate (11) is formed of metal and the photoconductive layer is cadmium sulphide spattered thereon to align the Cadmium Sulphide crystals normal to the metal plate (11).

7. A photoelectric imaging device according to claim 1 wherein the first layer of electrodes is positioned on the substrate and the electrodes (4) have an insulator medium (13) applied laterally therebetween, and the second layer of electrodes (8) and the imaging plates (11) are positioned on the first layer with a semiconductor interface (6) therebetween and have an insulator medium (13) deposited laterally between the plates (8) and the imaging plates (11) and bonded to the insulator medium (13) of the first layer.

8. A photoelectric imaging device according to claim 1 wherein the electrodes (8) of the rows (7) and the electrodes (4) of the columns (1) are formed as part of conductive strips (5,9) to be upstanding thereon and spaced apart thereon so that when a series of row (7) strips are spaced apart and placed over a series of spaced apart column (1) strips the row electrodes (8) and the column electrodes (1) are superimposed, and wherein an insulator (13) fills the lateral spaces between the electrodes (4,8).

9. The method of imaging a writing surface on an addressable module which module comprises pairs of discrete spaced electrodes (4,8) separated by a semiconductive interface (6) and arranged in rows (8) and columns (4) with each pair of electrodes having an associated imaging plate (11) forming part of a capacitor (31) chargeable by a flow control transistor (30), the pairs of electrodes (4,8) and associate imaging plates (11) forming a multiplicity of discrete chargeable areas on a writing surface (15) of the module (14), characterised by; applying a signal to selected imaging plates (11) on the writing surface (15) of the module (14) to define an electrostatic image on the writing surface (15), addressing the rows (7) and columns (1) by a computer to store the image in the computer memory, subsequently receiving the stored data from the computer on the imaging plates (11) in the form of a charge by addressing the rows (7) and columns (1) and rendering the image addressable.

10. The method of claim 8 wherein the image on the writing surface (15) has a rendering solution (21) applied to it containing particles influenced by the charge on the imaging plates.

11. The method of imaging according to claim 10 wherein the particles of the rendering solution (21) are transferred to a receiving surface (26) by applying the receiving surface (26) to the writing surface (15) and applying a transfer potential from a polarised high voltage device (28) between the module (14C) and an electrode (27) placed behind the receiving surface (26).

12. The method of imaging according to claim 8 in which the imaging plates have a photoconductive surface, characterised by applying the signal to selected imaging plates (11) by applying a light image to the photoconductive surface (12) on the imaging plates (11) whereby to control the charge level on each imaging plate (11).

13. The method of imaging according to claim 8 in which the imaging plates (11) are arranged to receive an electrical image signal, characterised by applying the signal to selected imaging plates by applying a light image to a remote photoconductive surface whereby to control the charge level on the remote photoconductive surface, and applying the remote surface to the imaging plates (11) to transfer the latent electrostatic image thereto.

14. The method of imaging according to claim 8 wherein the photoconductive surface (12) is charged in the absence of light and is then light-bled by a light image (18,19,20) projected on to the writing surface (15), and by sensing in a computer the electrostatic image data so generated on the row (7) and column (1) matrix.

15. The method of imaging according to claim 8 wherein an insulating film is placed over those imaging plates having a required polarity, and then applying a non-volatile conductive medium over the writing surface (15) to render selective areas conductive to allow the image to be read by the computer.

* * * * *